(12) United States Patent
Uetake et al.

(10) Patent No.: US 6,456,073 B2
(45) Date of Patent: Sep. 24, 2002

(54) DATA ACQUISITION METHOD OF COMPENSATION FOR MAGNETIC FIELD DRIFT, METHOD OF COMPENSATION FOR MAGNETIC FIELD DRIFT, AND MRI APPARATUS

(75) Inventors: Nozomu Uetake, Tokyo (JP); Susumu Kosugi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 12 days.

(21) Appl. No.: 09/792,851

(22) Filed: Feb. 24, 2001

(30) Foreign Application Priority Data

Apr. 7, 2000 (JP) ........................................ 2000-106675

(51) Int. Cl.⁷ ................................................ G01V 3/00
(52) U.S. Cl. ........................................ 324/309; 324/307
(58) Field of Search ................................ 324/307, 306, 324/309, 311, 312, 314, 300

(56) References Cited

U.S. PATENT DOCUMENTS

| 4,885,542 A | * | 12/1989 | Yao et al. ..................... 324/307 |
| 4,970,457 A | * | 11/1990 | Kaufman et al. ............ 324/307 |
| 5,652,514 A | * | 7/1997 | Zhang et al. ................ 324/307 |

* cited by examiner

Primary Examiner—Louis Arana
(74) Attorney, Agent, or Firm—Moonray Kojima

(57) ABSTRACT

In order to compensate for magnetic field drift and shorten the overall scanning time, total number of pulse sequences of data acquisition for magnetic field drift compensation Md is less than the repetitive number of imaging data acquisition pulse sequences Im, and a pulse sequence of data acquisition for magnetic field drift compensation Md is inserted between imaging data acquisition pulse sequences Im.

19 Claims, 6 Drawing Sheets

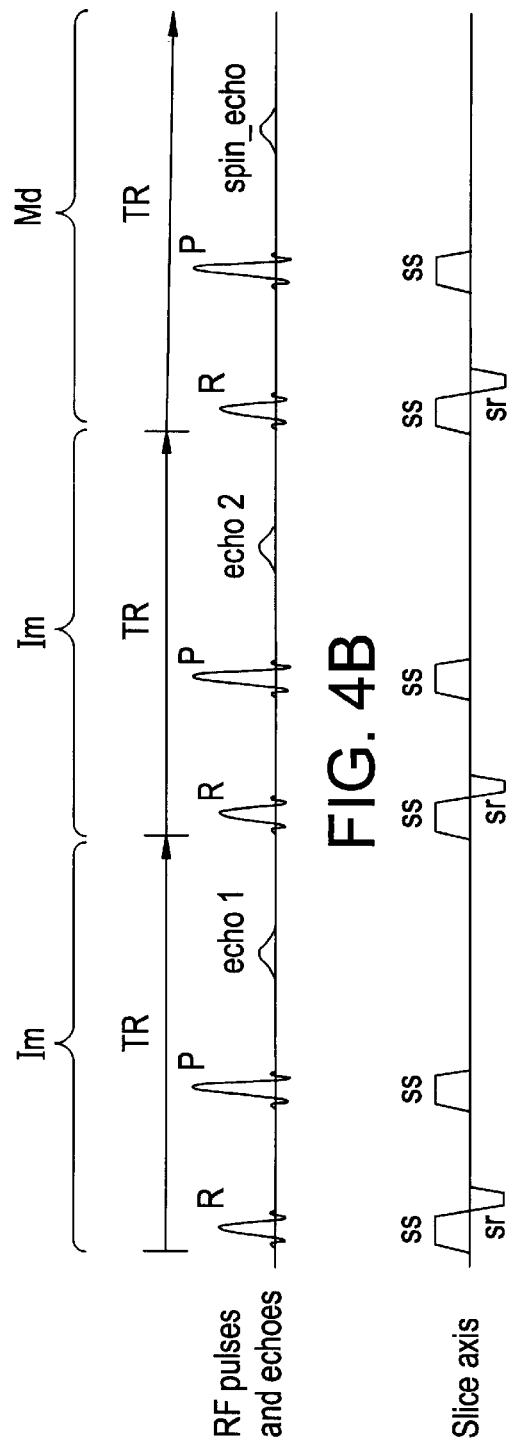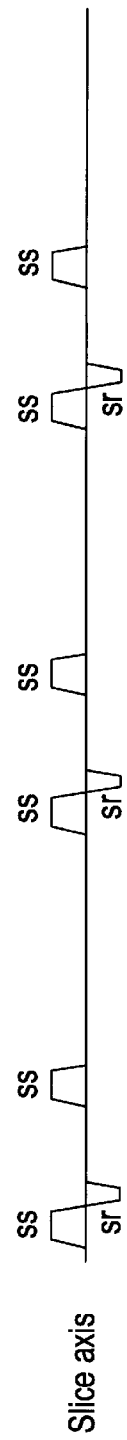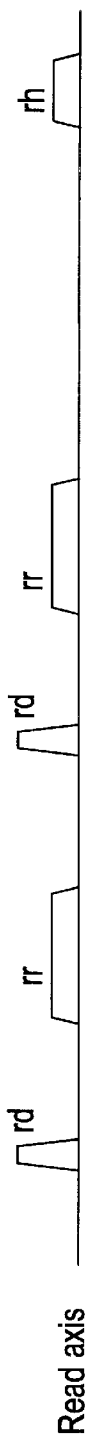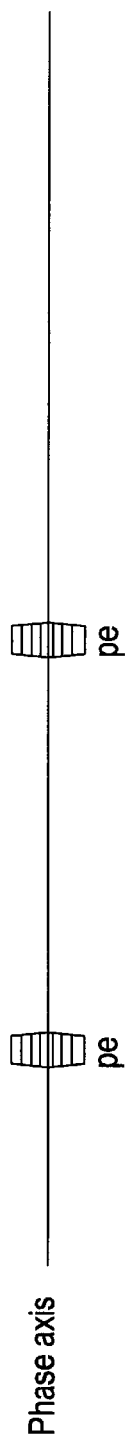
FIG. 4A
FIG. 4B
FIG. 4C
FIG. 4D

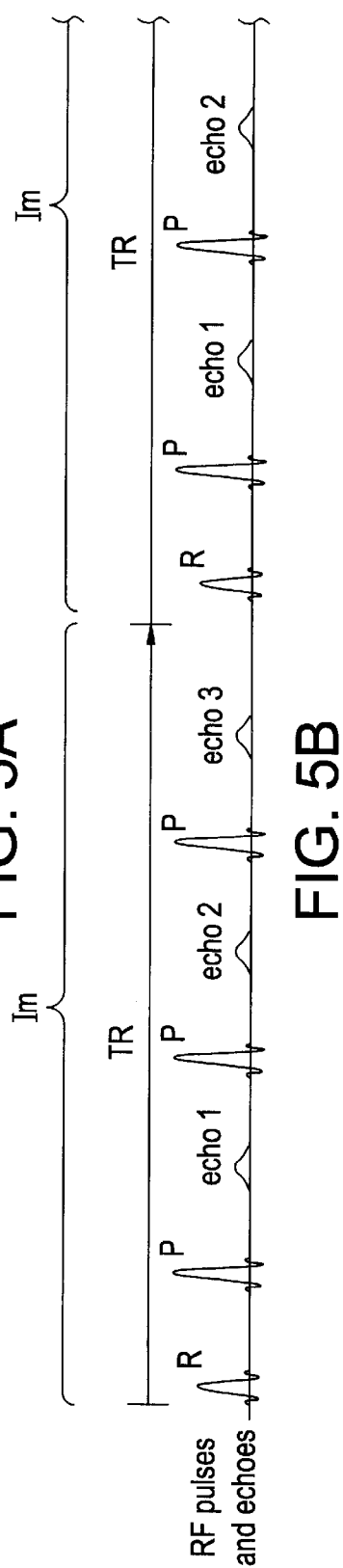
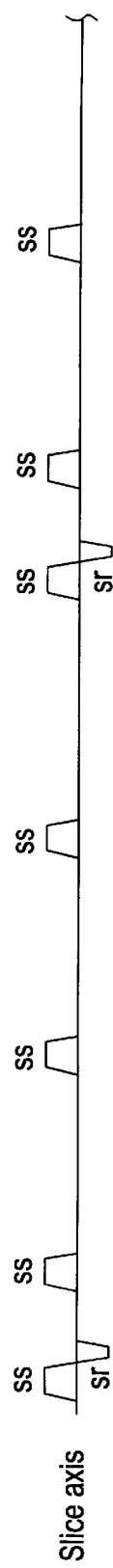
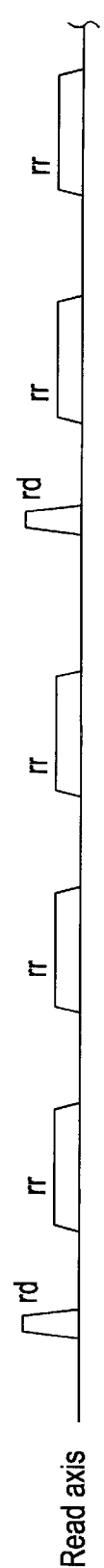
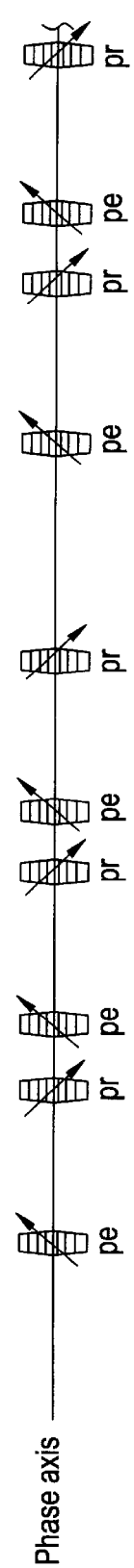
FIG. 5A
FIG. 5B
FIG. 5C
FIG. 5D

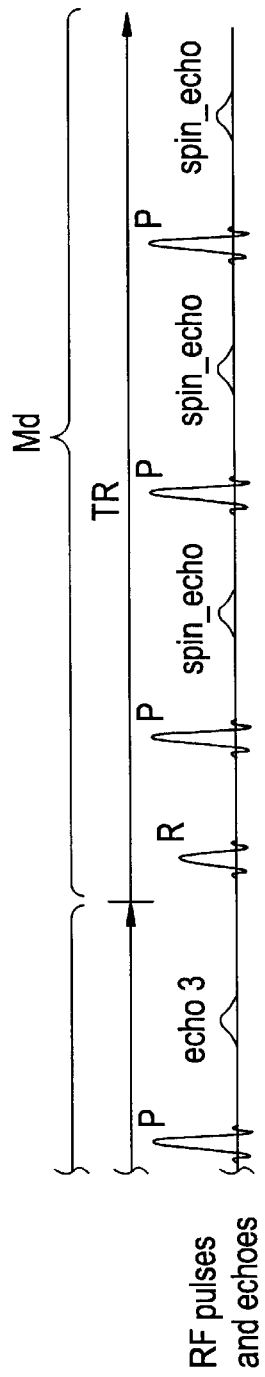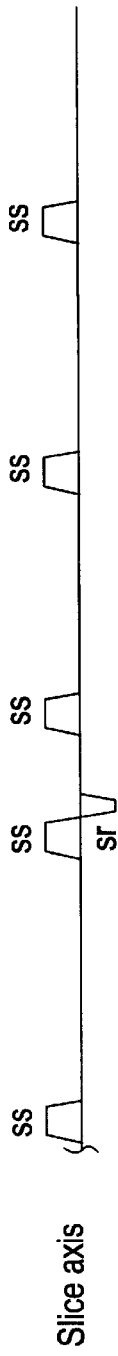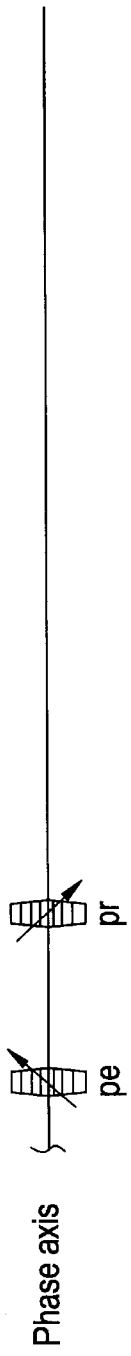
FIG. 5A-1  FIG. 5B-1  FIG. 5C-1  FIG. 5D-1

DATA ACQUISITION METHOD OF COMPENSATION FOR MAGNETIC FIELD DRIFT, METHOD OF COMPENSATION FOR MAGNETIC FIELD DRIFT, AND MRI APPARATUS

BACKGROUND OF THE INVENTION

The present invention relates to a data acquisition method of compensation for magnetic field drift, a method of compensation for magnetic field drift, and an MRI (magnetic resonance imaging) apparatus, and more particularly to a data acquisition method of compensation for magnetic field drift, a method of compensation for magnetic field drift, and an MRI apparatus, allowing improvement of the image quality by compensating for the magnetic field drift and reduction of overall scanning time.

In the method of compensation for magnetic field drift in an MRI apparatus, disclosed in the Japanese Unexamined Patent Publication No. H1-141656, data for magnetic field drift compensation is gathered for each view of imaging data to be acquired, and based on thus gathered data for magnetic field drift compensation the current flowing through the primary field coil may be adjusted in order to compensate for the magnetic field drifting.

In the magnetic field drift compensation according to the Prior Art technique above, magnetic field drift will be compensated for by measuring the magnetic field drift during gathering data for imaging. This technique allows compensation to be improved more accurately than gathering independent data for magnetic field drift compensation separated apart from data gathered for imaging.

There is however a drawback that the repetition time TR becomes longer, because the repetitive unity of pulse sequences includes a pulse sequence for gathering the imaging data, plus a pulse sequence for gathering data for compensation for magnetic field drift. Thus, when the desired contrast of image changes, the scanning time as whole will be longer.

SUMMARY OF THE INVENTION

Therefore, the object of the present invention is to provide a data acquisition method for magnetic field drift compensation, a method of magnetic field drift compensation, and an MRI apparatus, allowing improvement of the image quality by compensating for the magnetic field drift and reduction of overall scanning time.

In accordance with a first aspect of the present invention, a data acquisition method of magnetic field drift compensation is provided, characterized by N>M≧2, where: N is the number of repetition of pulse sequences for gathering imaging data, M is the total number of repetition of pulse sequences for gathering data for magnetic field compensation; and acquiring data for magnetic field compensation by interposing at least one or more pulse sequences for gathering data for magnetic field drift compensation between two pulse sequences for gathering imaging data.

In the data acquisition method of magnetic field drift compensation in accordance with the first aspect as have been mentioned above, the total number of pulse sequences for gathering data for magnetic field drift compensation, M, will be smaller than the repetition of pulse sequences for gathering imaging data, N, and a pulse sequence for gathering data for magnetic field drift compensation will be inserted between pulse sequences for gathering imaging data. For instance, When N=256, then M=128, one pulse sequence for gathering data for magnetic field drift compensation will be inserted between two pulse sequences for gathering imaging data. In this manner, the magnetic field drift can be measured during imaging data acquisition, so that the compensation accuracy will be improved, when compared with independent data acquisition of compensation for magnetic field drift separately. In addition, overall scanning time required may be shorter than adding a pulse sequence for gathering compensation data for magnetic field drift to each pulse sequence for gathering imaging data.

In accordance with a second aspect of the present invention, in the data acquisition method of magnetic field drift compensation of the arrangement described above, a method is provided, characterized in that the integral of gradient field in the imaging data acquisition pulse sequence will be equal to the integral of gradient field in the pulse sequence for data acquisition of compensation for drift in magnetic field, for each of axis in order to hold the steady state of spins.

In the data acquisition method of magnetic field drift compensation in accordance with the second aspect as have been described above, the integration of gradient field in the imaging data acquisition pulse sequence will be equal to the integration of gradient field in the pulse sequence for data acquisition of compensation for drift in magnetic field, such that the gradient field of the pulse sequences for data acquisition of compensation for drift in magnetic field, when inserted between the imaging data acquisition pulse sequences, will not affect to the imaging data acquisition pulse sequence.

In accordance with a third aspect of the present invention, in the data acquisition method of magnetic field drift compensation of the arrangement described above, a method is provided, characterized in that the imaging data acquisition pulse sequences are pulse sequences of the gradient echo method having read gradient for convergence of gradient echo, and the data acquisition pulse sequences of magnetic field drift compensation are pulse sequences without read gradient and phased gradient for convergence of gradient echo during imaging data acquisition pulse sequences.

In the data acquisition method of magnetic field drift compensation in accordance with the third aspect as have been described above, compensation data for magnetic field drift can be acquired, in a manner preferable to the imaging data acquisition by pulse sequences of the gradient echo method.

In accordance with a fourth aspect of the present invention, in the data acquisition method of magnetic field drift compensation of the arrangement described above, a method is provided, characterized in that the pulse sequences for acquiring imaging data are pulse sequences by the spin echo method having diffused read gradient between a 90° RF pulse and a 180° RF pulse, and the pulse sequences for acquiring compensation data for magnetic field drift are pulse sequences without diffuse read gradient in the imaging data acquisition pulse sequences, and corresponding read gradient and phase gradient after 180° RF pulses.

In the data acquisition method of magnetic field drift compensation in accordance with the fourth aspect as have been described above, compensation data for magnetic field drift can be acquired, in a manner preferable to the acquisition of imaging data by the pulse sequences of the spinning echo method.

In accordance with a fifth aspect of the present invention, in the data acquisition method of magnetic field drift compensation of the arrangement described above, a method is provided, characterized in that the pulse sequences for acquiring imaging data are pulse sequences of high-speed spinning echo method, having diffuse read gradient between a 90° RF pulse and a 180° RF pulse, and between a 180° RF pulse and another 180° RF pulse, the pulse sequences for acquiring magnetic field drift compensation data are pulse sequences without diffuse read gradient in the imaging data acquisition pulse sequence, and corresponding read gradient and phase gradient after a 180° RF pulse.

In the data acquisition method of magnetic field drift compensation in accordance with the fifth aspect as have been described above, compensation data for magnetic field drift can be acquired, in a manner preferable to the imaging data acquisition by pulse sequences of the high-speed spinning echo method (the multi-echo method also).

In accordance with a sixth aspect of the present invention, a method is provided, characterized by the step of adjusting the current of primary field coil based on the compensation data for magnetic field drift gathered in accordance with the data acquisition method of magnetic field drift of the arrangement described above.

In the method of compensation for magnetic field drift in accordance with the sixth aspect of the present invention, the current flowing through the primary field coil is adjusted so as to compensate for the magnetic field drift to improve the image quality.

In accordance with a seventh aspect of the present invention, a method of compensation for magnetic field drift is provided, characterized by the step of adjusting the transmission frequency based on the compensation data for magnetic field drift gathered in accordance with the data acquisition method of compensation for magnetic field drift of the arrangement as described above.

In the method of compensating for magnetic field drift in accordance with the seventh aspect of the present invention, the transmission frequency is adjusted so as to compensate for magnetic field drift to improve the image quality.

In accordance with an eighth aspect of the present invention, a method of compensation for magnetic field drift is provided, characterized by the step of adjusting the transmission frequency and reception frequency based on the compensation data for magnetic field drift gathered in accordance with the data acquisition method of compensation for magnetic field drift of the arrangement as have been described above.

In the eighth aspect of the compensation method of magnetic field drift, the transmission frequency and reception frequency are adjusted so as to compensating for magnetic field drift to improve the image quality.

In accordance with a ninth aspect of the present invention, a method of compensation for magnetic field drift is provided, characterized by the step of adjusting the phase of transmission or the phase of reception based on the compensation data for magnetic field drift gathered in accordance with the data acquisition method of compensation for magnetic field drift of the arrangement as have been described above.

In the ninth aspect of the compensation method of magnetic field drift, either the phase of transmission or the phase of reception may be adjusted so as to compensate for magnetic field drift to improve the image quality.

In accordance with a tenth aspect of the present invention, a method of compensation for magnetic field drift is provided, characterized by the step of carrying out phase compensating operation on the imaging data, based on the compensation data for magnetic field drift gathered by the data acquisition method of compensation for magnetic field drift of the arrangement as have been described above.

In the tenth aspect of the compensation method of magnetic field drift, the phase compensating operation will be performed on the imaging data so as to compensate for magnetic field drift to improve the image quality.

In accordance with an eleventh aspect of the present invention, an MRI apparatus is provided, characterized by comprising: an RF pulse transmitter means, a gradient pulse applicator means, an NMR signal receiver means, a means for controlling imaging data acquisition for acquiring imaging data by controlling each of the means, and a means for controlling compensation data acquisition for magnetic field drift for acquiring magnetic field drift compensation data by controlling each of the means, wherein the means for controlling compensation data acquisition for magnetic field drift is characterized by N>M≧2, where: N is the number of repetition of pulse sequences for gathering imaging data, M is the total number of repetition of pulse sequences for gathering data for magnetic field compensation; and acquiring data for magnetic field compensation by interposing at least one or more pulse sequences for gathering data for magnetic field drift compensation between two pulse sequences for gathering imaging data.

In the MRI apparatus in accordance with the eleventh aspect of the present invention, the data acquisition method for compensating for magnetic field drift in accordance with the aforementioned first aspect of the present invention may be preferably implemented.

In accordance with a twelfth aspect of the present invention, an MRI apparatus is provided, characterized in that in the means for controlling compensation data acquisition for magnetic field drift in the MRI apparatus of the arrangement as above, the integration of gradient field in the imaging data acquisition pulse sequence may be equal to the integration of gradient field in the pulse sequence for data acquisition of compensation for drift in magnetic field.

In the MRI apparatus in accordance with the twelfth aspect of the present invention, data acquisition method of compensating for magnetic field drift in accordance with the second aspect as have been described above may be preferably implemented.

In accordance with a thirteenth aspect of the present invention, an MRI apparatus is provided, characterized in that in the MRI apparatus of the arrangement as have been described above, the imaging data acquisition pulse sequences may be pulse sequences of the gradient echo method having read gradient for convergence of gradient echo, and the data acquisition pulse sequences of magnetic field drift compensation may be pulse sequences without read gradient and phased gradient for convergence of gradient echo during imaging data acquisition pulse sequences.

In the MRI apparatus in accordance with the thirteenth aspect of the present invention, data acquisition method of compensating for magnetic field drift in accordance with the third aspect as have been described above may be preferably implemented.

In accordance with a fourteenth aspect of the present invention, an MRI apparatus is provided, characterized in that in the MRI apparatus of the arrangement as have been described above, the pulse sequences for acquiring imaging data are pulse sequences by the spin echo method having diffused read gradient between a 90° RF pulse and a 180° RF pulse, and the pulse sequences for acquiring compensation data for magnetic field drift are pulse sequences without diffuse read gradient in the imaging data acquisition pulse sequences, and corresponding read gradient and phase gradient after 180° RF pulses.

In the MRI apparatus in accordance with the fourteenth aspect of the present invention, data acquisition method of magnetic field drift compensation in accordance with the fourth aspect of the present invention as have been described above may be preferably implemented.

In accordance with a fifteenth aspect of the present invention, an MRI apparatus is provided, characterized in that, in the MRI apparatus of the arrangement as have been described above, the pulse sequences for acquiring imaging data are pulse sequences of high-speed spinning echo method, having diffuse read gradient between a 90° RF pulse and a 180° RF pulse, and between a 180° RF pulse and another 180° RF pulse, the pulse sequences for acquiring magnetic field drift compensation data are pulse sequences without diffuse read gradient in the imaging data acquisition pulse sequence, and corresponding read gradient and phase gradient after a 180° RF pulse.

In the MRI apparatus in accordance with the fifteenth aspect of the present invention, the data acquisition method of the fifth aspect for compensating for magnetic field drift may be preferably implemented.

In accordance with a sixteenth aspect of the present invention, an MRI apparatus is provided, characterized in that it further comprises a means for controlling the current of primary field coil based on the compensation data for magnetic field drift gathered by the means for controlling compensation data acquisition for magnetic field drift, in the MRI apparatus of the arrangement as have been described above.

In the MRI apparatus in accordance with the sixteenth aspect of the present invention, the compensation method for magnetic field drift in accordance with the sixth aspect mentioned above may be preferably implemented.

In accordance with a seventeenth aspect of the present invention, an MRI apparatus is provided, characterized in that it further comprises a means for controlling excitation frequency for controlling the transmission frequency based on the compensation data for magnetic field drift gathered by the means for controlling compensation data acquisition for magnetic field drift, in the MRI apparatus of the arrangement as have been described above.

In the MRI apparatus in accordance with the seventeenth aspect of Lathe present invention, the compensation method of magnetic field drift in accordance with the seventh aspect mentioned above may be preferably implemented.

In accordance with an eighteenth aspect of the present invention, an MRI apparatus is provided, characterized in that it further comprises a means for controlling resonance frequency for controlling the transmission frequency and reception frequency based on the compensation data for magnetic field drift gathered by the means for controlling compensation data acquisition for magnetic field drift as mentioned above.

In the MRI apparatus in accordance with the eighteenth aspect of the present invention, the compensation method of magnetic field drift in accordance with the eighth aspect of the present invention may be preferably implemented.

In accordance with a nineteenth aspect of the present invention, an MRI apparatus is provided, characterized in that it further comprises a phase controller means for controlling the transmission phase or reception phase based on the compensation data for magnetic field drift gathered by the means for controlling compensation data acquisition for magnetic field drift in the MRI apparatus of the arrangement as mentioned above.

In the MRI apparatus in accordance with the nineteenth aspect of the present invention, the compensation method of magnetic field drift in accordance with the ninth aspect of the present invention as mentioned above may be preferably implemented.

In accordance with a twentieth aspect of the present invention, a method for compensating for magnetic field drift is provided, characterized in that it further comprises a means for operating phase compensation for performing the operation of phase compensation on the imaging data based on the compensation data for magnetic field drift gathered by the means for controlling compensation data acquisition for magnetic field drift in the MRI apparatus of the arrangement as aforementioned above.

In the MRI apparatus in accordance with twentieth aspect of the present invention, the compensation method for magnetic field drift of the tenth aspect as have been described above may be preferably implemented.

In accordance with the present invention, the method disclosed of acquiring compensation data for magnetic field drift, compensation method of magnetic field drift, and MRI apparatus may measure and compensate for the magnetic field drift during imaging data acquisition, allowing the precision of compensation to be improved. The overall scanning time may be shortened since total number of pulse sequences for compensation data acquisition for magnetic field drift may be fewer than the repetitive number of imaging data acquisition pulse sequences.

Further objects and advantages of the present invention will be apparent from the following description of the preferred embodiments of the invention as illustrated in the accompanying drawings.

BRIEF DESCRIPTION OF THE DRAWINGS

FIG. 4 is another example of pulse sequences in the data acquisition process according to the MRI apparatus shown in FIG. 1.

FIG. 5 is still another example of pulse sequences in the data acquisition process according to the MRI apparatus shown in FIG. 1.

DETAILED DESCRIPTION OF THE INVENTION

Figure 1:
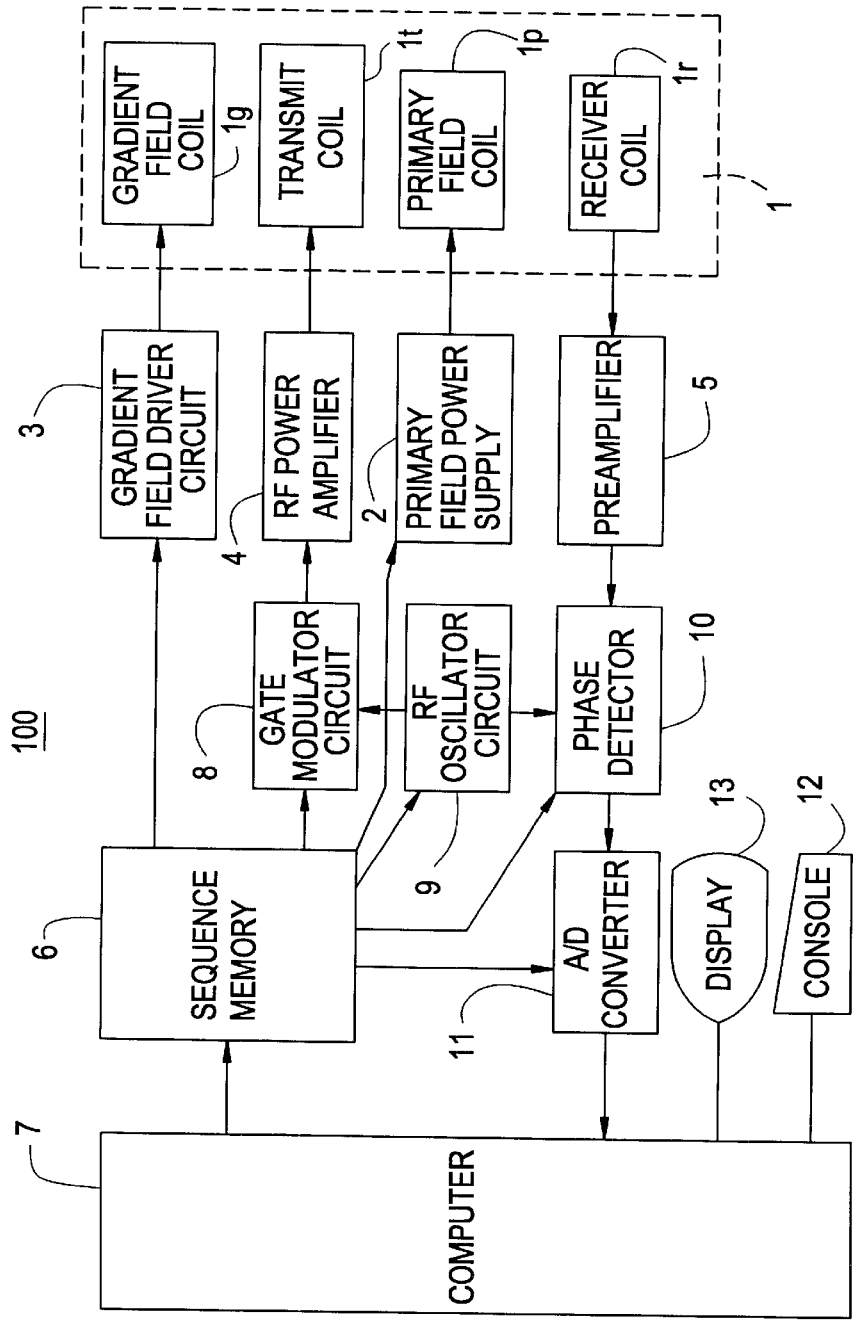
FIG. 1 is a schematic block diagram of an MRI apparatus in accordance with one preferred embodiment of the invention.

A detailed description of some of preferred embodiments, shown in the drawings, embodying the present invention will now be given referring to the accompanying drawings, herein below. FIG. 1 is a schematic block diagram of an MRI apparatus 100 in accordance with one preferred embodiment of the invention.

In this MRI apparatus 100, a magnet assembly 1 has a central lumen (bore) for inserting the subject to be examined therein, and the assembly also has a primary field coil 1p for applying primary magnetic field of constant strength to the subject, a gradient field coil 1g for generating gradient field in the slice axis, read axis, and phase axis, a transmitter coil 1t for applying RF pulses for exciting atomic spins within the subject, and a receiver coil 1r for detecting NMR signals originated from the subject, surrounding the bore. The primary field coil 1p, gradient field coil 1g, transmitter coil 1t, and receiver coil 1r are connected respectively to a primary field power supply 2, a gradient field driver circuit 3, an RF power amplifier 4, and a preamplifier 5.

Permanent magnets may be used in place of the primary field coil 1p.

A sequence memory 6 drives the gradient field driver circuit 3 based on the pulse sequence stored therein under the instruction from a computer 7 to cause the gradient field coil 1g of the magnet assembly 1 to generate gradient field. The sequence memory 6 also drives a gate modulator circuit 8 to modulate the carrier output signal of an RF oscillator circuit 9 into pulse signals with a predetermined form of envelopes and predetermined timings to apply it as RF pulses to the RF power amplifier 4. The RF pulses will be power amplified in the RF power amplifier 4, applied to the transmitter coil 1t of the magnet assembly 1 to selectively excite a desired slice area.

The preamplifier 5 will amplify the NMR signals from the subject detected by the receiver coil 1r of the magnet assembly 1 prior to input to a phase detector 10. The phase detector 10 will phase detect the NMR signals via the preamplifier 5 by referring to the carrier output signals generated by the RF oscillator circuit 9 and then pass the signal to an A/D converter 11. The A/D converter 11 will analog-to-digital convert the phase detected analog signals into digital signals to be fed to the computer 7.

The computer 7 will read data from the A/D converter 11 to operate for image reconstruction thereon to generate an image of the desired slice area. This image will be displayed on a display 13. The computer 7 will also control the entire system such as accepting information input from a console 12.

Figure 2:
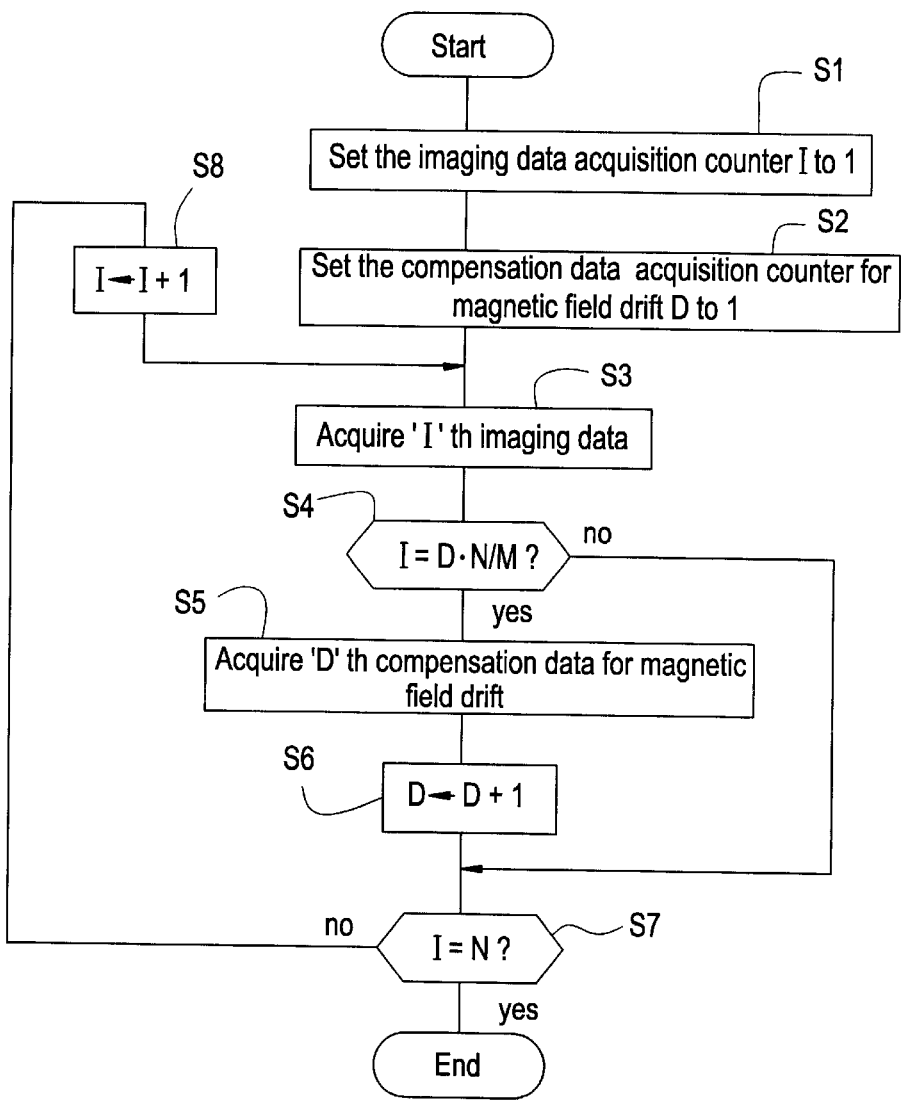
FIG. 2 is a flow diagram of data acquisition process according to the MRI apparatus shown in FIG. 1.
Figure 3A:
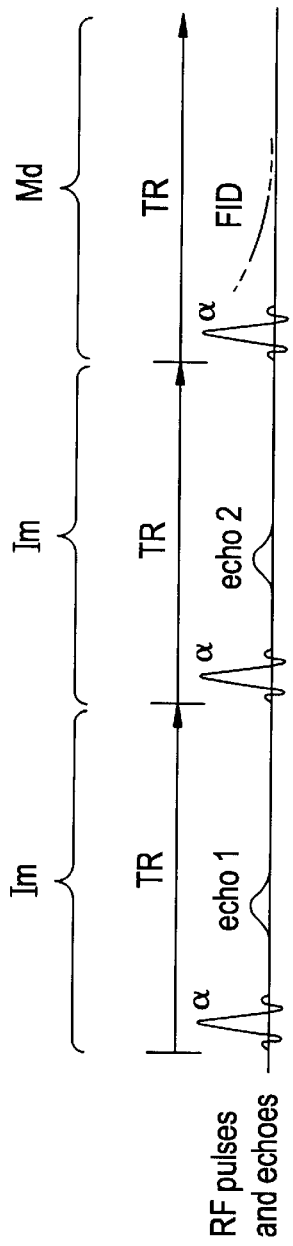
FIG. 3 is an example of pulse sequences in the data acquisition process according to the MRI apparatus shown in FIG. 1.
Figure 3B:
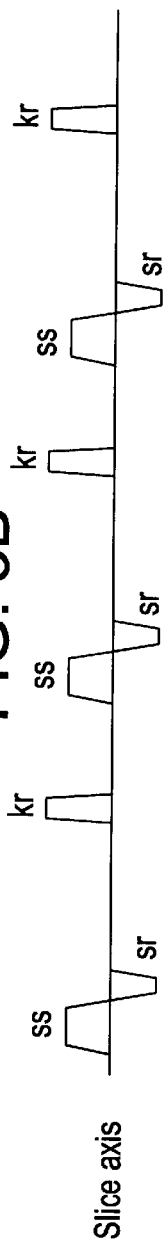
Figure 3C:
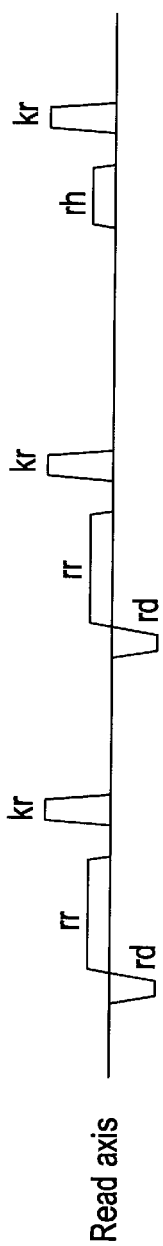
Figure 3D:
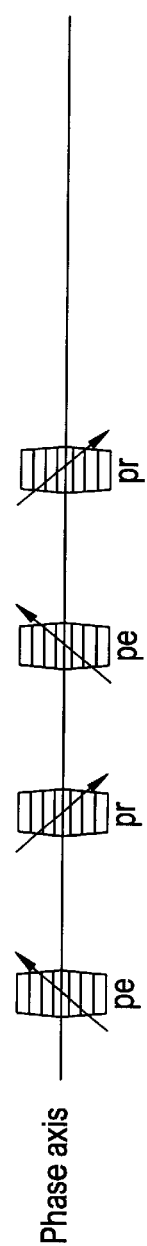

FIG. 2 is a flow diagram illustrating the data acquisition in the MRI apparatus 100. Here N>M≧2, where: N is the number of repetition of pulse sequences for gathering imaging data, and M is the total number of repetition of pulse sequences for gathering data for magnetic field compensation.

In step S1 of FIG. 2, imaging data acquisition counter I will be cleared to be initialized to '1'.

In step S2, compensation data acquisition counter for magnetic field drift D will be cleared to be initialized to '1'.

In step S3, 'I'th imaging data will be gathered by using imaging data acquisition pulse sequences.

In step S4, if I=D·N / M is true then the process proceeds to step S5, if false then the process proceeds to step S7.

In step S5, 'D'th compensation data for magnetic field drift will be gathered by using the pulse sequences of compensation data acquisition for magnetic field drift.

In step S6, the compensation data acquisition counter for magnetic field drift D will be incremented by '1', and the process proceeds to step S7.

In the steps S3 to S6 above, assuming that N=256 and M=128, one pulse sequence of compensation data acquisition for magnetic field drift will be inserted after I=2, 4, 6, . . . and so on, i.e., for each two imaging data acquisition pulse sequences.

In step S7, if I=N is true then the process terminates, otherwise, if not, the process proceeds to step S8.

In step S8, the imaging data acquisition counter I will be incremented by '1' and the process goes back to the step S3.

FIG. 3 is an exemplary pulse sequences in the data acquisition process as have been described above.

In the pulse sequences shown, pulse sequences of gradient echo mode will be used for the imaging data acquisition pulse sequences Im.

Also, for the pulse sequences of data acquisition for magnetic field adrift compensation Md, pulse sequences used are without read gradient (leading halfway of 'rd' and 'rr') for converging the gradient echoes (echo 1, echo 2) in the imaging data acquisition pulse sequences Im, and phase gradient ('pe' and 'pr'). Compensation data for magnetic field drift can be acquired from within FID signals.

By evenly distributing the integral gradient in respective axis, the integral of gradient field ('rd', 'rr') in the imaging data acquisition pulse sequences Im will be equal to the integral of gradient field ('rh') of the pulse sequences of data acquisition for magnetic field drift compensation Md. In addition, no gradient field is applied to the phase axis in the pulse sequences of data acquisition for magnetic field drift compensation Md, because the integral of gradient field ('pe', 'pr') in the imaging data acquisition pulse sequences Im becomes '0'.

FIG. 4 is another example of pulse sequences in the data acquisition process as have been described above.

In those pulse sequences, spinning echo mode pulse sequences are used for the imaging data acquisition pulse sequences Im.

For the pulse sequences of data acquisition for magnetic field drift compensation Md, pulse sequences used are without the diffuse read gradient ('rd') between a 90° RF pulse R and a 180° RF pulse P in the imaging data acquisition pulse sequences Im, and the read gradient (leading half of 'rr') and phase gradient ('pe') corresponding thereto after the 180° RF pulse P. Data for magnetic field drift compensation can be acquired from within the spin_echo signals.

FIG. 5 is still another example of pulse sequences in the data acquisition process as have been described above.

In this example of pulse sequences, pulse sequences of high-speed spin echo mode are used for the imaging data acquisition pulse sequences Im.

For the pulse sequences of data acquisition for magnetic field drift compensation Md, diffuse read gradient (trailing half of 'rd' and 'rr') between a 90° pulse R and a 180° RF pulse P and between a 180° pulse P and another 180° pulse P in the imaging data acquisition pulse sequences Im, as well as the read gradient (leading half of 'rr') and phase gradient ('pe') corresponding thereto after the 180° RF pulse P. Data for magnetic field drift compensation can be acquired from within the first spin_echo signal.

By evenly distributing the integral gradient in respective axis, the integral of gradient field ('rd', 'rr') in the imaging data acquisition pulse sequences Im will be equal to the integral of gradient field ('rh') of the pulse sequences of data acquisition for magnetic field drift compensation Md. In addition, no gradient field is applied to the phase axis in the pulse sequences of data acquisition for magnetic field drift compensation Md, because the integral of gradient field ('pe', 'pr') in the imaging data acquisition pulse sequences Im becomes '0'.

When applying slice encoding to the slice axis in the pulse sequences shown in FIG. 5, pulse sequences will be 3D.

The aforementioned MRI apparatus 100 may compensate magnetic field drift after acquiring compensation data for magnetic field drift during the data acquisition process described above, in either of the followings:

(1) by controlling the current flowing through the primary field coil 1p based on the compensation data for magnetic field drift, (2) by controlling the transmitting frequency of the RF oscillator circuit 9 based on the compensation data for magnetic field drift, (3) by controlling the transmitting frequency and receiving frequency of the RF oscillator circuit 9 based on the compensation data for magnetic field drift, (4) by controlling the transmitting phase in the gate modulator circuit 8 or the receiving phase in the phase detector 10 based on the compensation data for magnetic field drift, or (5) by operating the phase compensation on the imaging data in the computer 7, based on the compensation data for magnetic field drift.

In accordance with the MRI apparatus 100 disclosed herein, magnetic field drift may be measured and compensated for during acquisition of imaging data, allowing the compensation to be more accurate than the compensation by separate and independent acquisition of compensation data for magnetic field drift apart from the imaging data. Furthermore, overall scanning time may be shortened when comparing with the addition of a pulse sequence for compensation data for magnetic field drift for each imaging data acquisition pulse sequence.

Many widely different embodiments of the invention may be configured without departing from the spirit and the scope of the present invention. It should be understood that the present invention is not limited to the specific embodiments described in the specification, except as defined in the appended claims.

What is claimed is:

1. A method of compensating for magnetic field drift, comprising the steps of:
    applying pulse sequences for gathering imaging data;
    applying pulse sequences for gathering data for magnetic field compensation; and
    acquiring data for magnetic field compensation by interposing at least one or more pulse sequences for gathering data for magnetic field drift compensation between two pulse sequences for gathering imaging data; wherein
        an integral of gradient field in said imaging data acquisition pulse sequences is equal to an integral of gradient field in said drift compensation data acquisition pulse sequences for each axis so as to hold a steady state of spins; and wherein
            said drift compensation data acquisition pulse sequences are without read gradient.

2. The method of claim 1, wherein said imaging data acquisition pulse sequences are pulse sequences provided by a gradient echo method having read gradient for convergence of gradient echo; and wherein said drift compensation data acquisition pulse sequences are pulse sequences without read gradient and phased gradient for convergence of gradient echo during imaging data acquisition pulse sequences.

3. The method of claim 1, wherein said pulse sequences for acquiring imaging data are pulse sequences provided by a spin echo method having diffused read gradient between a 90° RF pulse and a 180° RF pulse; and wherein said pulse sequences for acquiring drift compensation data are pulse sequences without diffuse read gradient in said imaging data acquisition pulse sequences, and with corresponding read gradient and phase gradient after the 180° RF pulse.

4. The method of claim 1, wherein said pulse sequences for acquiring imaging data are pulse sequences provided by a high speed spinning echo method having diffuse read gradient between a 90° RF pulse and a 180° RF pulse; and wherein said pulse sequences for acquiring drift compensation data are pulse sequences without diffuse read gradient in said imaging data acquisition pulse sequences and with corresponding read gradient and phase gradient after the 180° RF pulse.

5. The method of claim 1, further comprising the step of adjusting of primary field coil based on said drift compensation data.

6. The method of claim 1, further comprising the step of adjusting transmission frequency based on said drift compensation data.

7. The method of claim 1, further comprising the step of adjusting transmission frequency and reception frequency based on said drift compensation data.

8. The method of claim 1, further comprising the step of adjusting phase of transmission or phase of reception based on said drift compensation data.

9. The method of claim 1, further comprising the step of carrying out phae compensation operation on imaging data based on said drift compensation data.

10. An MRI apparatus comprising:
    an RF pulse transmitter;
    a gradient pulse applicator;
    an NMR signal receiver;
    a first control device for controlling imaging data acquisition to acquire imaging data by controlling said RF pulse transmitter, said gradient pulse applicator, and said NMR signal receiver; and
    a second control device for controlling compensation data acquisition for magnetic drift to acquire drift compensation data by controlling said RF pulse transmitter, said gradient pulse applicator, and said NMR signal receiver; wherein said second control device comprises:
        means for acquiring data for magnetic field compensation by interposing at least one or more pulse sequences for gathering data for magnetic field drift compensation between two pulse sequences for gathering imaging data; wherein
            an integral of gradient field in said imaging data acquisition pulse sequences is equal to an integral of gradient field in said drfit compensation data acquisition pulse sequences for each axis so as to hold a steady state of spins; and wherein
                said drift compensation data acquisition pulse sequences are without read gradient.

11. The apparatus of claim 10, wherein said second control device comprises means for controlling imaging data acquisition pulse sequences to be pulse sequences of a gradient echo method having read gradient for convergence of gradient echo; and means for controlling said drift compensation data pulse sequences to be pulse sequences without read gradient and phase gradient for convergence of gradient echo during imaging data acquisition pulse sequences.

12. The apparatus of claim 10, wherein said second control device comprises means for controlling pulse sequences for acquiring imaging data to be pulse sequences by a spin echo method having diffused read gradient between a 90° RF pulse and a 180° RF pulse; and means for controlling pulse sequences for acquiring drift compensation data to be pulse sequences without diffuse read gradient in said imaging data acquisition pulse sequences and with corresponding read gradient and phase gradient after the 180° RF pulse.

13. The apparatus of claim 10, wherein said second control device compries means for controlling pulse sequences for acquiring imaging data to be pulse sequences of a high speed spinning echo method having diffuse read gradient between a 90° RF pulse and a a 180° RF pulse, and between a 180° RF pulse and another 180° RF pulse; and means for controlling pulse sequences for acquiring drift compensation data to be pulses without diffuse read gradient in said imaging data acquisition pulse sequences and with corresponding read gradient and phase gradient after a 180° RF pulse.

14. The apparatus of claim 10, further comprising a third control device for controlling current of a primary field coil based on said drift compensation data.

15. The apparatus of claim 10, further comprising a third control device for controlling transmission or reception frequency based on Said drift compensation data.

16. The apparatus of claim 10, further comprising a third control device for controlling resonance frequency based on said drift compensation data.

17. The apparatus of claim 10, further comprising a third control device for controlling transmission phase or reception phase based on said drift compensation data.

18. The apparatus of claim 17, further comprising a phase compensation device for carrying out phase compensation on said imaging data based on said drift compensation data.

19. The apparatus of claim 15, further comprising a frequency compensation device for carrying out operation of frequency compensation on said imaging data based on said drift compensation data.

* * * * *